(12) United States Patent
Dewa et al.

(10) Patent No.: US 9,778,284 B2
(45) Date of Patent: Oct. 3, 2017

(54) SEMICONDUCTOR PROBE, TESTING DEVICE AND TESTING METHOD FOR TESTING QUANTUM BATTERY

(75) Inventors: Harutada Dewa, Musashino (JP); Kiyoyasu Hiwada, Musashino (JP); Akira Nakazawa, Kobe (JP)

(73) Assignees: KABUSHIKI KAISHA NIHON MICRONICS, Tokyo (JP); GUALA TECHNOLOGY CO., LTD., Kobe (JP)

( * ) Notice: Subject to any disclaimer, the term of this patent is extended or adjusted under 35 U.S.C. 154(b) by 326 days.

(21) Appl. No.: 14/404,803

(22) PCT Filed: May 31, 2012

(86) PCT No.: PCT/JP2012/064232
§ 371 (c)(1),
(2), (4) Date: Feb. 18, 2015

(87) PCT Pub. No.: WO2013/179471
PCT Pub. Date: Dec. 5, 2013

(65) Prior Publication Data
US 2015/0192611 A1    Jul. 9, 2015

(51) Int. Cl.
G01R 1/067 (2006.01)
H01L 21/66 (2006.01)
G01R 31/36 (2006.01)

(52) U.S. Cl.
CPC ......... G01R 1/067 (2013.01); G01R 1/06744 (2013.01); G01R 1/06761 (2013.01);
(Continued)

(58) Field of Classification Search
CPC ...... G01R 3/00; G01R 1/067; G01R 1/06738; G01R 1/073; G01R 1/06761
(Continued)

(56) References Cited

U.S. PATENT DOCUMENTS

| 7,936,178 B2* | 5/2011 | Ting | G01R 1/06761 257/48 |
| 8,803,539 B2* | 8/2014 | Rathburn | G01R 1/07314 324/755.01 |
| 2004/0008033 A1* | 1/2004 | Howland | G01R 31/2648 324/527 |
| 2005/0223543 A1* | 10/2005 | Cohen | G01R 1/06716 29/602.1 |

(Continued)

FOREIGN PATENT DOCUMENTS

JP    H06275690 A    9/1994
JP    2000019233 A    1/2000
(Continued)

OTHER PUBLICATIONS

Aug. 14, 2012 International Search Report issued in International Patent Application No. PCT/JP2012/064232.

*Primary Examiner* — Jermele M Hollington
*Assistant Examiner* — Christopher McAndrew
(74) *Attorney, Agent, or Firm* — Oliff PLC

(57) ABSTRACT

A testing device and method of a quantum battery by a semiconductor probe capable of evaluating electric characteristics of a charge layer in the middle of a production process of the quantum battery without damaging the charge layer. On semiconductor probe constituted by stacking electrode and metal oxide semiconductor on support body, and probe charge layer is formed of the same material as that of quantum battery and irradiated with ultraviolet rays. Forming probe charge layer of same material as that of quantum battery on semiconductor probe enables evaluation without damaging charge layer of the quantum battery. Testing device and method are provided which measure the charge/discharge characteristics of a charge layer in the middle of producing the quantum battery by a voltmeter and a constant current source or a discharge resistor by using the semiconductor probe including the probe charge layer.

22 Claims, 16 Drawing Sheets

(52) U.S. Cl.
 CPC ..... *G01R 31/3624* (2013.01); *G01R 31/3665* (2013.01); *H01L 22/14* (2013.01)
(58) Field of Classification Search
 USPC .................................................. 324/755.01
 See application file for complete search history.

(56) References Cited

U.S. PATENT DOCUMENTS

| | | | |
|---|---|---|---|
| 2005/0255796 A1* | 11/2005 | Haga | B08B 1/00 451/41 |
| 2008/0157794 A1* | 7/2008 | Fukami | G01R 1/0735 324/755.01 |
| 2009/0133741 A1* | 5/2009 | Higuchi | H01G 9/2031 136/252 |
| 2014/0008763 A1* | 1/2014 | Mujumdar | H01L 22/34 257/535 |
| 2014/0327445 A1* | 11/2014 | Dewa | H01M 10/48 324/437 |

FOREIGN PATENT DOCUMENTS

| | | | | |
|---|---|---|---|---|
| JP | 2000021455 A | | 1/2000 | |
| JP | 2000028625 A | | 1/2000 | |
| JP | 2001267384 A | | 9/2001 | |
| JP | 2002141062 A | | 5/2002 | |
| JP | 2002313398 A | | 10/2002 | |
| JP | 2005524925 A | | 8/2005 | |
| JP | 2007005279 A | | 1/2007 | |
| JP | 2007285802 A | * | 11/2007 | ............... G01R 3/00 |
| JP | 2008241349 A | | 10/2008 | |

* cited by examiner (A)

(B)

SEMICONDUCTOR PROBE, TESTING DEVICE AND TESTING METHOD FOR TESTING QUANTUM BATTERY

TECHNICAL FIELD

The present invention relates to a semiconductor probe, a testing device, and a testing method, for testing an all-solid battery based on a novel operation principle of utilizing a photoexcitation structural change of a metal oxide by ultraviolet irradiation to form an energy level in a band gap so as to trap electrons.

BACKGROUND ART

As a secondary battery used in an electric vehicle and a mobile device, a nickel-metal hydride secondary battery is often mounted. Recently, a lithium-ion battery has been developed as a secondary battery that can be increased in output and capacity and is at the stage of start of practical use.

The lithium-ion battery is made by using a metal double oxide containing lithium for a cathode and a material that can receive and release lithium such as carbon for an anode, and impregnating it with an electrolytic solution composed of a lithium salt capable of dissociating into ions and an organic solvent capable of dissolving the lithium salt (refer to Patent Document 1 and so on).

From the need to increase the safety of the battery at wrong use because the electrolytic solution is liquid and therefore may leak and an inflammable material is used, an all-solid lithium secondary battery using a solid electrolyte in place of the electrolytic solution is also disclosed (refer to Patent Document 2 and so on).

The lithium-ion battery is expensive in cost because of use of lithium being a rare metal, and therefore a secondary battery with higher performance and larger capacity is required also in terms of performance.

Under such a situation, the present inventors suggest an all-solid type semiconductor battery (hereinafter, referred to as a quantum battery) capable of reduction in cost and safe operation with a simple configuration (PCT/JP 2010-067643).

The quantum battery is constituted by stacking a substrate, a conductive base electrode, a charge layer having an n-type metal oxide semiconductor covered with an insulating material and undergone a photoexcitation structural change to form an energy level in a band gap so as to trap electrons, a P-type semiconductor layer, and a conductive counter electrode. A power supply is connected between the base electrode and the counter electrode to charge the charge layer.

For the quantum battery, current-voltage characteristics and charge/discharge characteristics are evaluated for confirming the function in its production process.

The current-voltage characteristics are generally known as a method of evaluating the characteristics of a semiconductor and is applied to performance evaluation also for the secondary battery.

For example, there is a method of detecting the internal resistance on the basis of the measurement values of the voltage and the current at the time of discharging and the time of charging a hybrid vehicle battery, and estimating accurate current-voltage characteristics of the battery to detect more accurate internal resistance of the battery (refer to Patent Document 3 and so on). There is another method of dividing an output range of a battery into a plurality of regions, measuring a predetermined number of sets of voltage and current for each of the regions, specifying the current-voltage characteristics of the battery on the basis of the measurement values, and calculating the maximum output of the battery on the basis of the current-voltage characteristics (refer to Patent Document 4 and so on).

Further, for producing the quantum battery, the performance as the secondary battery depends on the charge layer, and therefore more efficient production is possible by evaluating the charge layer in the middle where the charge layer is stacked in the production process than by evaluating the charge layer in a complete product.

Evaluation of the function in the middle of the production process is means performed in a field of the semiconductor. For example, there is a measuring device in which a measuring source electrode and a measuring drain electrode are provided exposed on both sides of a measuring gate electrode covered with an insulating film for the purpose of directly measuring the electric characteristics of the semiconductor being an active layer of a field effect thin film transistor without actually creating it.

When the exposed surfaces of the measuring source electrode, the measuring drain electrode, and the insulating film between them are brought into contact with the surface of the semiconductor, the contact portion constitutes a coplanar-type pseudo electric field effect thin film transistor. This enables, before creation of an element, measurement similar to that in the case of the normal coplanar-type pseudo electric field effect thin film transistor after creation of the element (refer to Patent Document 5 and so on).

There also is a method of accurately measuring the current-voltage characteristics when evaluating an SOI substrate using a pseudo MOSFET and suppressing the influence by temporal change to the minimum to thereby obtain a value with good reproducibility (refer to Patent Document 6 and so on), and a semiconductor probe for measurement (refer to Patent Document 7 and so on) is also suggested.

PRIOR ART DOCUMENT

Patent Document

Patent Document 1: Japanese Laid-open Patent Publication No. 2002-141062
Patent Document 2: Japanese Laid-open Patent Publication No. 2007-5279
Patent Document 3: Japanese Laid-open Patent Publication No. 2000-21455
Patent Document 4: Japanese Laid-open Patent Publication No. 2000-19233
Patent Document 5: Japanese Laid-open Patent Publication No. H06-275690
Patent Document 6: Japanese Laid-open Patent Publication No. 2001-267384
Patent Document 7: Japanese Laid-open Patent Publication No. 2005-524925

DISCLOSURE OF THE INVENTION

Problems to be Solved by the Invention

However, the quantum battery is an all solid-type secondary battery based on a novel principle, and therefore it is impossible to apply the conventional method as it is in order to evaluate the secondary battery in the middle of the production process and evaluate the charge/discharge characteristics and the current-voltage characteristics as the battery characteristics, and the structure and the features unique to the quantum battery should be taken into account.

In particular, the charge layer of the quantum battery has a structure in which an n-type metal oxide semiconductor made in the form of fine particles covered with insulating coating, so that when it is evaluated by a semiconductor probe, the insulating coating peels off by mechanical contact with the semiconductor probe and the charge layer is damaged in some cases. Therefore, the evaluation of the charge layer is not directly performed, but a test area for evaluation is provided and evaluation of the charge layer formed in the test area is made as evaluation of the charge layer as the quantum battery.

An object of the present invention is to provide a semiconductor probe, a testing device, and a testing method, capable of evaluating electric characteristics of a charge layer without peeling nor damaging insulating coating so as to enable direct evaluation of the electric characteristics of the charge layer in the middle of a production process of a quantum battery.

Means to Solve the Problems

A target as an object to be measured in the present invention is a quantum battery, and the quantum battery is constituted by stacking a conductive base electrode, a charge layer having an n-type metal oxide semiconductor covered with an insulating material and undergone a photoexcitation structural change to form an energy level in a band gap so as to trap electrons, a P-type semiconductor layer, and a conductive counter electrode, on a substrate. An n-type metal oxide semiconductor layer may be provided between the base electrode and the charge layer for more stable operation.

To evaluate the electric characteristics of the charge layer at the point in time when the charge layer is stacked in the quantum battery, layers to be further stacked on the charge layer are formed in a semiconductor probe, and the semiconductor probe is brought into contact with the charge layer to measure the electric characteristics, thereby evaluating the function of the charge layer in a final complete product.

The semiconductor probe according to the present invention includes: a conductive electrode; a metal oxide semiconductor layer made of a metal oxide semiconductor; and a charge layer that charges electric energy therein, which are stacked on a support body.

The charge layer is an n-type metal oxide semiconductor covered with an insulating material, and has an n-type metal oxide semiconductor covered with an insulating material and undergone a photoexcitation structural change by ultraviolet irradiation to form an energy level in a band gap so as to trap electrons. The n-type metal oxide semiconductor is one kind of titanium dioxide, tin oxide, and zinc oxide, or a complex material made by combining two or three kinds of titanium dioxide, tin oxide, and zinc oxide. The insulating material covering the n-type metal oxide semiconductor is an insulating resin or an inorganic insulating material.

The metal oxide semiconductor is a p-type semiconductor, and is, for example, nickel oxide or copper/aluminum oxide. Further, from the correspondence with the object to be measured, the metal oxide semiconductor may be an n-type semiconductor which is one kind of titanium dioxide, tin oxide, and zinc oxide, or a complex material made by combining two or three kinds of titanium dioxide, tin oxide, and zinc oxide.

As the conductive metal, copper or chromium is used. At least a part of the support body is an elastic body which controls a contact pressure when the semiconductor probe is brought into contact with the charge layer of the quantum battery so as to bring a probe surface into close contact with the surface of the object to be measured. The whole support body may be an elastic body.

The support body may be in a cylindrical shape, and the conductive electrode, the metal oxide semiconductor layer, and the charge layer are stacked on an outer peripheral surface of the support body. Further, the support body may be provided with a ground electrode part that is brought into contact with the base electrode of the object to be measured.

A charge/discharge characteristics testing device, includes: the semiconductor probe according to the present invention; an object to be measured; a charge/discharge current source that performs charge/discharge; and a voltmeter that measures a voltage of the object to be measured at the time of charge/discharge.

The evaluation of the object to be measured in which a conductive base electrode or a base electrode and an n-type metal oxide semiconductor layer is/are stacked on a substrate, also enables evaluation of electric characteristics of the base electrode or the base electrode and the n-type metal oxide semiconductor layer at the stage of producing the quantum battery because the charge layer is stacked in the semiconductor probe according to the present invention. In the evaluation of the object to be measured in which an electrode and a charge layer composed of an n-type metal oxide semiconductor covered with an insulating material are stacked on a substrate, the charge layer is evaluated. The charge layer is made of a same material as a material of the charge layer of the semiconductor probe, and has an n-type metal oxide semiconductor covered with an insulating material and undergone a photoexcitation structural change by ultraviolet irradiation to form an energy level in a band gap and thereby has a function as the quantum battery.

The semiconductor probe is brought into close contact with the object to be measured in a manner to cover an entire surface thereof and evaluates the electric characteristics of the electrode and the charge layer. The semiconductor probe is brought into close contact with a plurality of the objects to be measured in a manner to cover entire surfaces thereof, and thereby can concurrently measure a plurality of electrodes and charge layers. Further, the semiconductor probe is brought into contact with the object to be measured in a manner to cover a part thereof, and thereby can locally evaluate the charge layer and evaluate variations in characteristics within a charge layer surface.

The semiconductor probe having a support body in a cylindrical shape can evaluate charge/discharge characteristics while being rotated on a surface of the object to be measured. Using two semiconductor probes each having the support body in a cylindrical shape also makes it possible that one of the semiconductor probes evaluates charge characteristics of the object to be measured and another of the semiconductor probes evaluates discharge characteristics of the object to be measured.

The present invention provides a charge/discharge characteristics testing method using a semiconductor probe, the method including: preparing: a semiconductor probe constituted by stacking a conductive electrode, a metal oxide semiconductor layer made of a metal oxide semiconductor, a charge layer that charges electric energy therein, and a support body; an object to be measured; a charge/discharge current source that performs charge/discharge; and a voltmeter that measures a voltage of the object to be measured at the time of charge/discharge; and bringing the semiconductor probe into contact with the object to be measured;

charging/discharging by the charge/discharge current source; and measuring the voltage of the of the object to be measured by the voltmeter.

Note that it is also possible to apply a voltage source as the power supply at the time of charge, in which case the current is measured. Further, a resistor may be applied in place of the current source as the load at the time of discharge.

Effects of the Invention

According to the present invention, in a quantum battery constituted by stacking a substrate, a conductive base electrode, a charge layer having an n-type metal oxide semiconductor covered with an insulating material and undergone a photoexcitation structural change to form an energy level in a band gap so as to trap electrons, a P-type semiconductor layer, and a conductive counter electrode, a charge layer having the same configuration as that of the charge layer of the quantum battery as an object to be measured is stacked in a semiconductor probe including an electrode and a metal oxide semiconductor layer, so that the charge layers can be brought into contact with each other to evaluate the electric characteristics without damaging the charge layer of the quantum battery. Further, at the stage before the charge layer of the objet to be measured is stacked, the charge/discharge function as the quantum battery can be evaluated because the semiconductor probe includes the charge layer.

Further, the support body of the semiconductor probe is formed in a size to cover the entire charge layer surface and to include a plurality of layers each constituted of independent electrode and metal oxide semiconductor layer, thereby making it possible to concurrently measure the distribution and the variation of the characteristics in charge layer regions, efficiently grasp the characteristics, and facilitate the identification and repair of abnormal points and faulty points.

On the other hand, the support body of the semiconductor probe is formed in a size to cover a part of the charge layer surface, thereby making it possible to measure the distribution, the variation, and the differential measurement of the characteristics in the charge layer region.

The semiconductor probe has the support body formed in a cylindrical shape, and thereby can evaluate the electric characteristics while being rotated on the charge layer surface, thereby enabling efficient evaluation.

BEST MODE FOR CARRYING OUT THE INVENTION

The present invention is a semiconductor probe, a testing device, and a testing method, for evaluating electric characteristics in a manufacturing process of a quantum battery being a secondary battery based on a novel charging principle employing a photoexcitation structural change technology for a charge layer. For more clearly understanding and explaining the present invention, the structure and principle of the quantum battery being an application target will be described first, and embodiments for carrying out the present invention will be described next.

Figure 1:
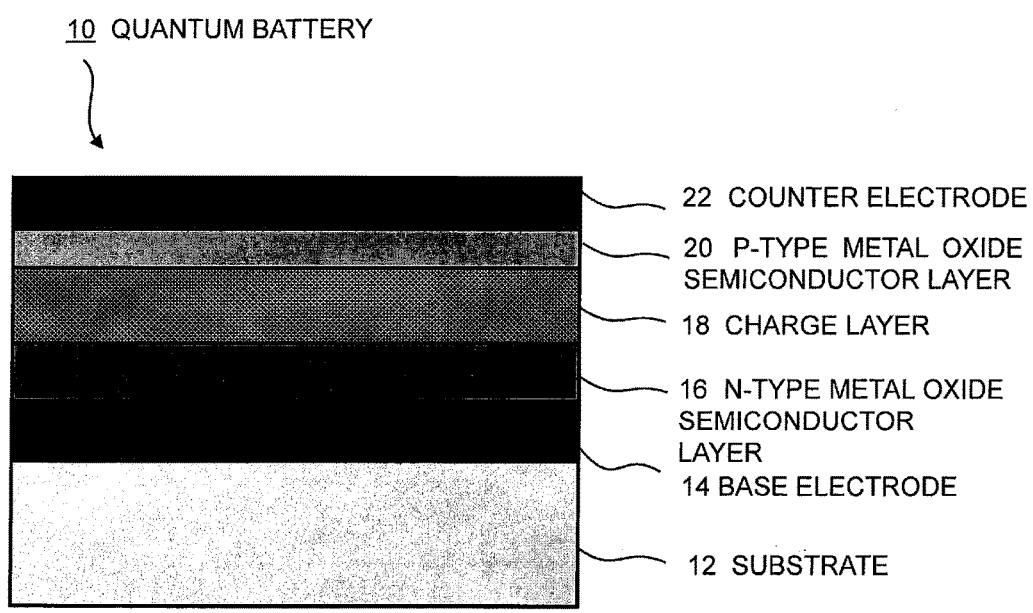
FIG. 1 is a view illustrating a configuration of a quantum battery to which a testing device and a testing method for a quantum battery by a conductor probe according to the present invention are applied.

FIG. 1 is a view illustrating a cross-sectional structure of a quantum battery to which the present invention is applied. In FIG. 1, a quantum battery 10 is configured such that a conductive base electrode 14 is formed on a substrate 12, and an n-type metal oxide semiconductor layer 16, a charge layer 18 that charges electric energy therein, a p-type metal oxide semiconductor layer 20, and a counter electrode 22 are further stacked thereon.

The substrate 12 may be an insulating material or a conductive material and, for example, a glass substrate, a resin sheet of a polymer film, or a metal foil sheet is usable therefor.

As the base electrode 14 and the counter electrode 22, conductive films only need to be formed, and examples of metal material include, for example, a silver Ag alloy film containing aluminum Al and the like. Examples of the method of forming them include sputtering, ion-plating, and vapor-phase film forming methods such as electron beam deposition, vacuum deposition, chemical vapor deposition and the like. Further, the base electrode 14 and the counter electrode 22 can be formed by the electrolytic plating method, the electroless plating method and the like. As the metal used for the plating, copper, copper alloy, nickel, aluminum, silver, gold, zinc, tin or the like can be generally used.

The n-type metal oxide semiconductor layer 16 uses titanium dioxide ($TiO_2$), tin oxide ($SnO_2$), or zinc oxide (ZnO) as the material.

Figure 2:
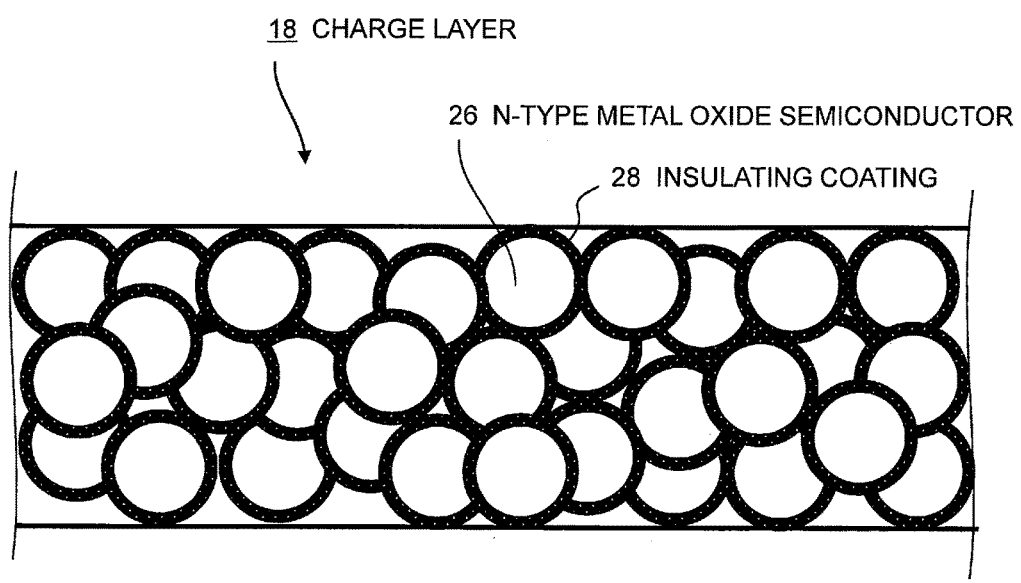
FIG. 2 is a view for explaining a charge layer of the quantum battery.

As illustrated in FIG. 2, the charge layer 18 has an n-type metal oxide semiconductor in the form of fine particles covered with insulating coating filled therein and undergone a photoexcitation structural change by ultraviolet irradiation to form into a layer having a charge function. The n-type metal oxide semiconductor is covered with silicone insulating coating. As the n-type metal oxide semiconductor material usable in the charge layer 18, titanium dioxide, tin oxide ($SnO_2$), and zinc oxide (ZnO) are preferable, and a material made by combining titanium dioxide, tin oxide, and zinc oxide may be usable.

The p-type metal oxide semiconductor formed on the charge layer 18 is provided to prevent injection of electrons from the counter electrode 22 at the upper part. As the material of the p-type metal oxide semiconductor layer 20, nickel oxide (NiO), copper/aluminum oxide ($CuAlO_2$) and the like can be used.

The fine particles of titanium dioxide in the charge layer 18 have insulating coatings formed of silicone which, however, are not limited to be uniform coatings but vary, and thus may come into direct contact with the electrode in the case of large variations. In this case, electrons are injected into the titanium dioxide due to recombination, and therefore no energy level is formed in the band gap to decrease the charging capacity. Accordingly, to suppress the decrease in charging capacity so as to achieve a higher-performance secondary battery, the n-type metal oxide semiconductor layer 16 is formed between the base electrode 14 and the charge layer 18 as illustrated in FIG. 1.

Figure 3:
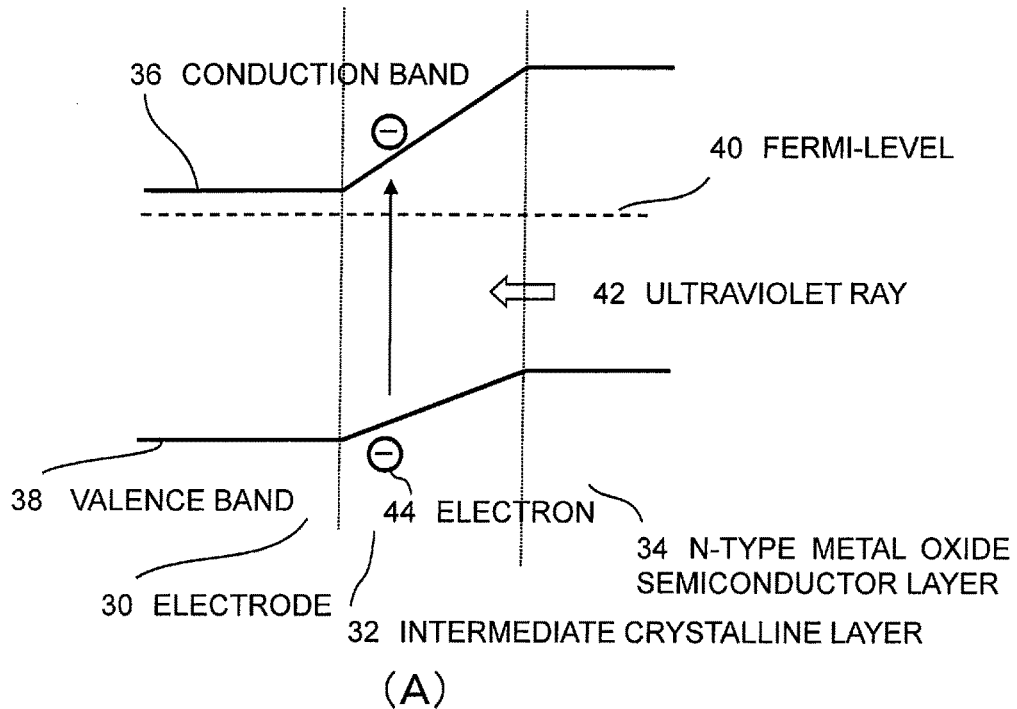
FIG. 3 is a band chart for explaining a photoexcitation structural change.
Figure 3:
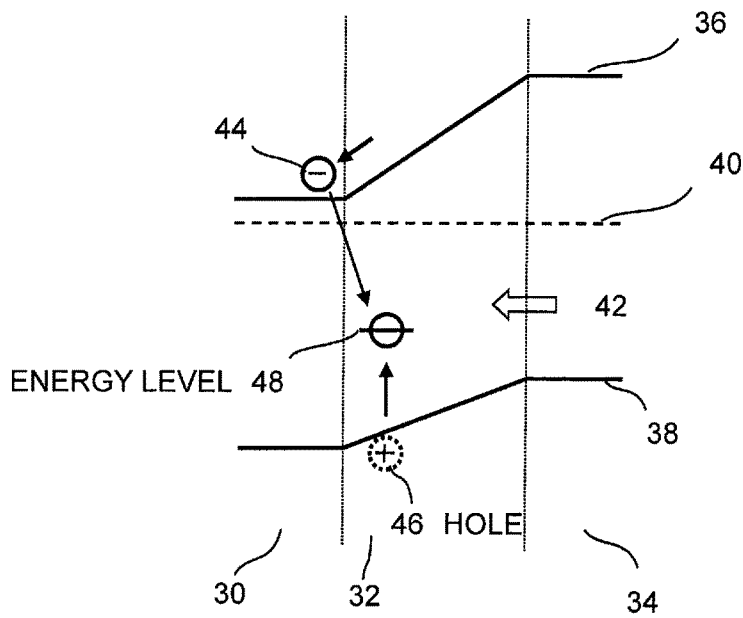

FIGS. 3(A), (B) illustrate band charts of a model structure for explaining the basic phenomenon in which a new energy level is formed by the photoexcitation structural change of the charge layer irradiated with ultraviolet rays.

The band chart in FIG. 3(A) is composed of an electrode 30, an intermediate crystalline layer 32, and an n-type metal oxide semiconductor layer 34. There is a Fermi-level 40 between a conduction band 36 and a valence band 38, the Fermi-level 40 of the electrode 30 exists close to the conduction band 36, and the Fermi-level 40 of the n-type metal oxide semiconductor layer 34 exists at the middle between the conduction band 36 and the valence band 38. When irradiated with ultraviolet rays 42, electrons 44 existing in the valence band 38 of the intermediate crystalline layer 32 are excited to the conduction band 36.

In the state during ultraviolet irradiation illustrated in FIG. 3(B), the electrons 44 in the valence band 38 in a region of the intermediate crystalline layer 32 are excited to the conduction band 36 by the irradiation with the ultraviolet rays 42, and the excited electrons 44 are accommodated in the conduction band 36 of the electrode 30 due to the inclination of the conduction band 36. On the other hand, holes 46 made by removal of the electrons 44 stay in the valence band 38. In the intermediate crystalline layer 32, a time difference occurs between the ultraviolet excitation and the recombination, and atoms are rearranged because of the time difference. Therefore, the holes 46 staying in the valence band 38 of the intermediate crystalline layer 32 move into the band gap to form a new energy level 48.

Figure 4:
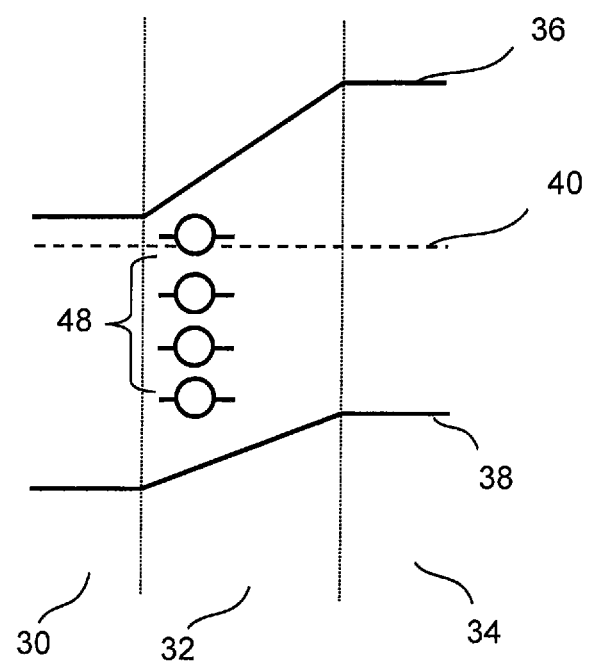
FIG. 4 is a band chart for explaining new energy levels formed by the photoexcitation structural change.

FIG. 4 illustrates the state after recombination in which new energy levels 48 are formed in the band gap in the intermediate crystalline layer 32. An increase in electron density in the band gap and a chemical shift of core electrons are observed only at the interface between the electrode 30 and the n-type metal oxide semiconductor layer 34, and the interatomic spacing is considered to have changed.

The fact that new energy levels 48 can be formed as described above in the band gap by irradiating the n-type metal oxide semiconductor layer 34 with the ultraviolet rays 42 has been described. For the secondary battery, a barrier can be formed by an insulating layer between the electrode and the n-type metal oxide semiconductor utilizing the newly formed energy levels 48 so as to control electrons and thereby provide a charge function.

The charge layer 18 illustrated in FIG. 1 is an n-type metal oxide semiconductor 26 made of titanium dioxide as a material formed with insulating coating 28 made of silicone as has been described in FIG. 1 and FIG. 2. In this case, the barrier is provided, by the insulating layer, between the titanium dioxide and the base electrode.

The quantum battery functions as a battery by applying voltage from outside to the energy level formed in the bad gap to form an electric field to fill electrons, and then connecting a load to the electrode and thereby releasing the electrons to extract energy. By repeating this phenomenon, the quantum battery can be used as the secondary battery.

The production process of the quantum battery is the process of sequentially stacking functional layers on a substrate, and the function of the charge layer is most important. If the charge layer can be evaluated at the point in time when the charge layer is stacked without waiting for completion of the quantum battery, it becomes possible not only to eliminate defective products and thereby establish an efficient mass-production process but also to investigate the cause of abnormal points and failures by identifying them and thereby facilitate management as well as maintenance and improvement of production facilities.

Figure 5:
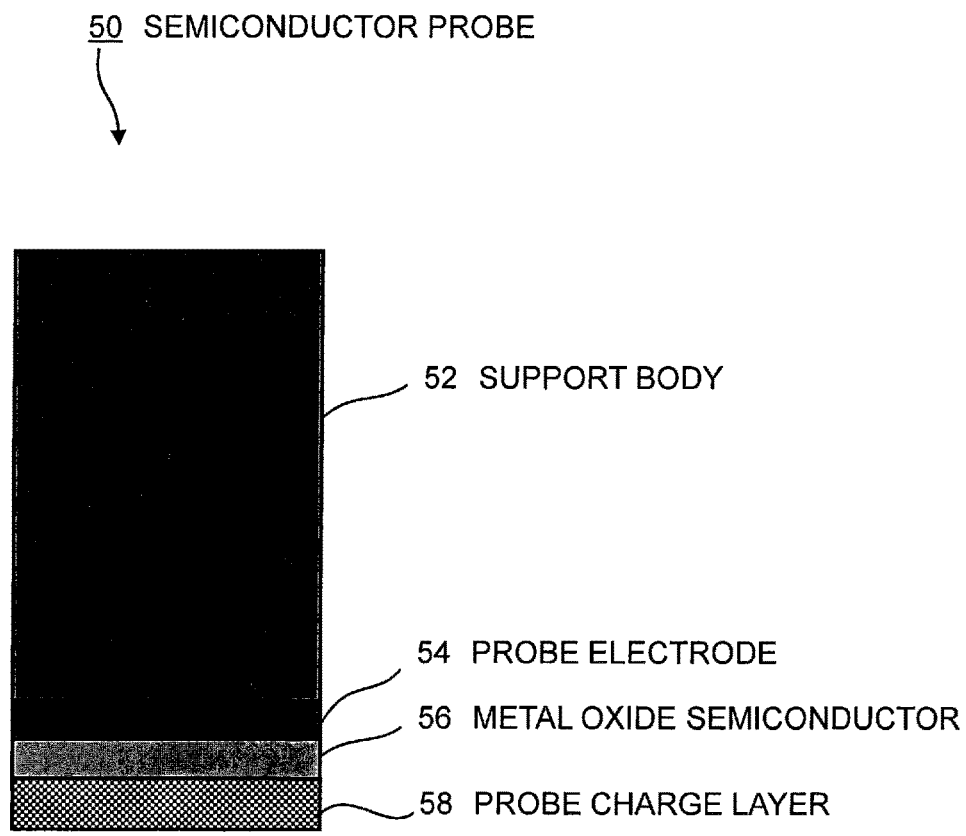
FIG. 5 is a view for explaining a semiconductor probe according to the present invention.

FIG. 5 illustrates a semiconductor probe according to the present invention. In the production process of the quantum battery, a functional evaluation is performed after stacking of the charge layer. Note that after stacking of the charge layer means the state that the charge layer is stacked and irradiated with the ultraviolet rays, whereby the photoexcitation structural change is excited in the n-type metal oxide semiconductor in the charge layer.

In FIG. 5, a semiconductor probe 50 is constituted by stacking an electrode (hereinafter, referred to as a probe electrode 54 for discrimination from the electrode of the quantum battery) composed of a conductive metal layer and a metal oxide semiconductor 56 on a support body 52 being an insulator.

The material of the metal oxide semiconductor 56 differs depending on the relative relation of an object to be measured, namely, the order of stacking the functional layers of the quantum battery 10. In the quantum battery 10 illustrated in FIG. 1 is in the state that the n-type metal oxide semiconductor layer 16 and the charge layer 18 are stacked on the substrate 12, the p-type metal oxide semiconductor layer 20 and the counter electrode 22 will further be stacked thereon, and therefore the metal oxide semiconductor 56 of the semiconductor probe 50 is a p-type metal oxide semiconductor and has the same material and the same layer thickness as those of the quantum battery 10 being the object.

The quantum battery 10 does not need to have the order of stacking the functional layers as illustrated in FIG. 1, but may have a structure in which the counter electrode 22, the p-type metal oxide semiconductor layer 20, the charge layer 18, the n-type metal oxide semiconductor layer 16, and the base electrode 14 are stacked in order on the substrate 12. In this case, the semiconductor probe 50 used for evaluation after the charge layer 18 is stacked has an n-type metal oxide semiconductor as the metal oxide semiconductor 56.

In the semiconductor probe 50 according to the present invention, the functional layers after stacking of the charge layer 18 in the quantum battery 10 illustrated in FIG. 1 are provided, and the semiconductor probe 50 is brought into vertical close contact with the top of the charge layer 18 with respect to the quantum battery 10 under production in which the charge layer 18 has been stacked. This makes it possible for the semiconductor probe 50 to operate as the quantum battery so as to evaluate the charge layer. The evaluation of the charge layer 18 after stacking of the charge layer 18 of the quantum battery is possible in the state that the probe electrode 54 and the metal oxide semiconductor 56 are stacked in the semiconductor probe 50.

However, a face of the semiconductor probe 50, namely, the surface of the p-type metal oxide semiconductor 56 is hard and thus may scratch the charge layer of the quantum battery due to press when it comes into contact with the charge layer of the quantum battery. This is because the charge layer is covered with insulating coating but this insulating coating is a resin such as silicone or the like and is thus a face much softer than metal.

Therefore, a charge layer (hereinafter, referred to as a probe charge layer 58 for discrimination from the charge layer of the quantum battery) made of the same material as that of the charge layer of the quantum battery is further stacked on the metal oxide semiconductor 56 of the semiconductor probe 50 in the present invention.

The metal oxide semiconductor 56 is not limited in material and film thickness but preferably has the same material and the same layer thickness as those of the quantum battery 10 being the object. This is to further improve the evaluation accuracy of the electric characteristics for the charge layer of the quantum battery.

In contrast, the probe electrode 54 of the semiconductor probe 50 for evaluation test only needs to have conducting properties and does not need to have the same material and the same layer thickness as those of the quantum battery 10 being the object, and a metal plate, a plated plate, a conductive resin or the like can be used therefor.

The support body 52 only needs to have a shape convenient for handling the semiconductor probe 50, and is desirably made of an insulating material. Further, the support body 52 can be made to have a function of bringing a tip portion of the semiconductor probe 50 into close contact with the charge layer, in which case the support body 52 is made of an elastic body and the semiconductor probe 50 is pressurized. The pressurization with a proper pressure by controlling a contact pressure between the charge layer of the semiconductor probe 50 and 18 via the elastic body improves the close contact property. As a concrete example of the elastic material is an elastomer, and various kinds of elastomers can be used.

The purpose of making the support body 52 of the elastic body is to improve the close contact property between the semiconductor probe 50 and the charge layer of the quantum battery by the proper contact pressure along an uneven surface of the charge layer 18 composed of the fine particles, and a part of the support body 52 may be made of the elastic body so as to make a structure in which the solid and the elastic body are combined together for the purpose.

Next, a charge/discharge characteristics testing device that measures electric characteristics of the quantum battery using the semiconductor probe according to the present invention will be described.

Figure 6:
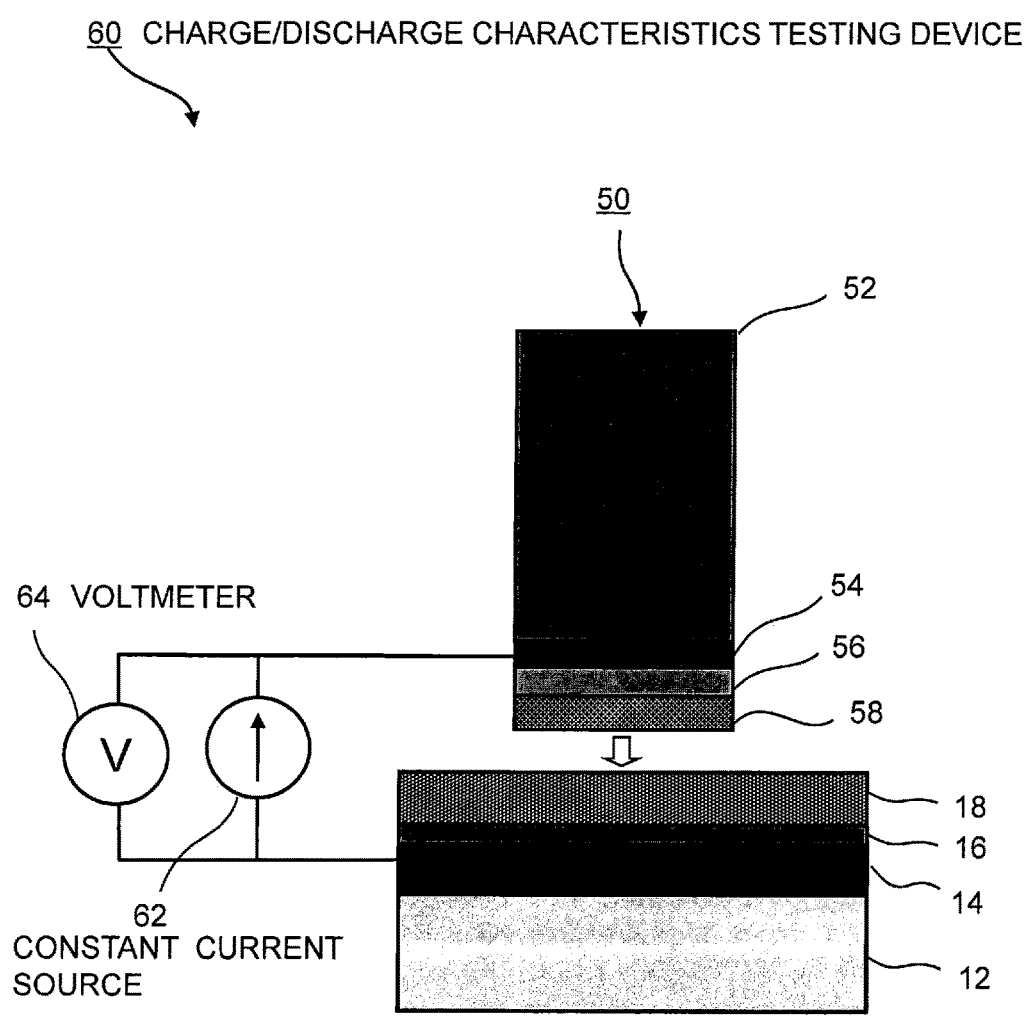
FIG. 6 is a view illustrating the outline of a charge/discharge characteristics evaluating device at the time of charge.

FIG. 6 is a view illustrating the outline of a charge/discharge characteristics testing device 60 using the semiconductor probe according to the present invention, and is a schematic view in the case of evaluating the charge characteristics of the charge layer in the quantum battery. It is composed of the semiconductor probe 50, a constant current source 62, and an object to be measured. The probe charge layer 58 of the semiconductor probe 50 is brought into close contact with the charge layer 18 of the quantum battery being the object to be measured with pressure. This forms a state that all of the functional layers as the quantum battery are stacked. In the case of evaluating the charge characteristics, the constant current source 62 is used as a charge/discharge current source.

The quantum battery being the object to be measured is in the middle of the manufacturing process, in which the base electrode 14, the n-type metal oxide semiconductor 16, and the charge layer 18 are stacked on the substrate 12. As the quantum battery being the object to be measured, for example, a polyimide film is used for the substrate 12, a copper alloy is used for the base electrode 14, and titanium dioxide is used for the n-type metal oxide semiconductor layer 16. Further, the charge layer 18 is composed of titanium dioxide fine particles coated with silicone and irradiated with ultraviolet rays before measurement.

The probe electrode 54 of the semiconductor probe 50 and the base electrode 14 of the quantum battery are connected to each other to charge the probe charge layer 58 and the charge layer 18 of the quantum battery with the current from the constant current source 62. A voltage limiter is provided at the constant current source 66 to set an upper limit voltage to a voltage value being a charging voltage of the quantum battery in this case, to protect the charge layer. The charging voltage is measured by a voltmeter 64, and the charge characteristics of the quantum battery can be obtained from the rising characteristics of the charging voltage.

Utilizing the features that the charge layer 58 is provided in the semiconductor probe 50 also enables electrode evaluation in the state before the charge layer of the quantum battery is stacked as the evaluation of the quantum battery as the object to be measured in the manufacturing process. Evaluation of the charge characteristics using the semiconductor probe 50 in the state that the base electrode 14 is stacked on the substrate 12 of the quantum battery enables evaluation of the base electrode 14 as the electrode. Also in the state that the base electrode 14 and the n-type metal oxide semiconductor 16 are stacked on the substrate 12, a similar evaluation is possible.

Figure 7:
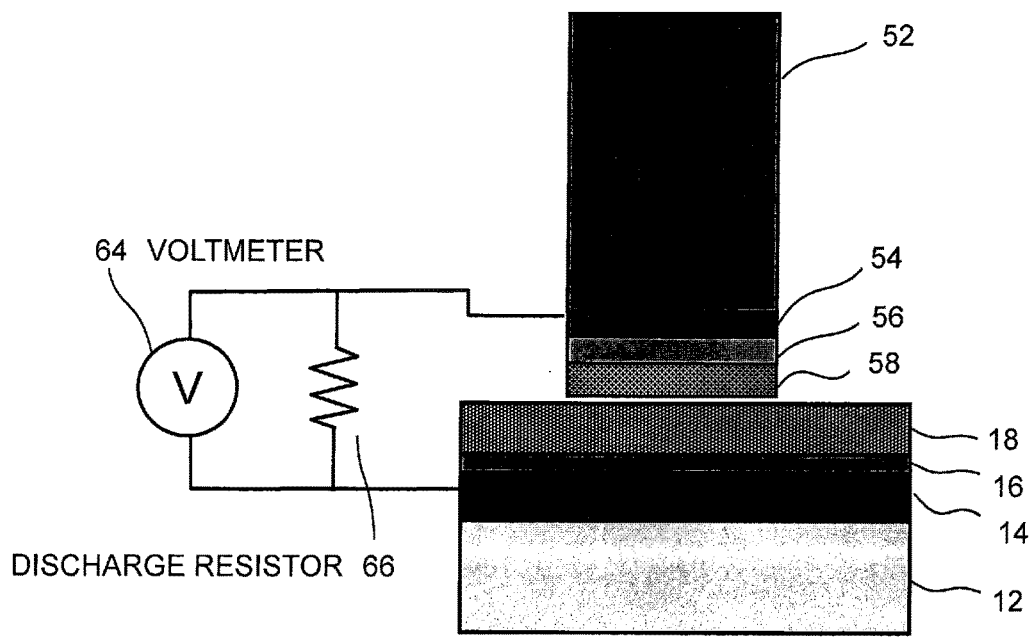
FIG. 7 is a view illustrating the outline of the charge/discharge characteristics evaluating device at the time of discharge.

FIG. 7 is a view illustrating the outline of the charge/discharge characteristics testing device 60 using the semiconductor probe according to the present invention, and is a schematic view in the case of evaluating the discharge characteristics of the charge layer in the quantum battery. It is composed of the semiconductor probe 50, a discharge resistor 66, and the object to be measured. In contrast to the case of evaluating the charge characteristics described in FIG. 6, the constant current source 62 is switched to the discharge resistor 66.

The charge layer 18 of the quantum battery and the probe charge layer 58 which have been charged by the constant current source 62 release electric energy stored therein by current flowing through the discharge resistor 66. The voltmeter 64 measures the characteristics of the voltage across the discharge resistor 66 of dropping with time so as to obtain the discharge characteristics.

Figure 8:
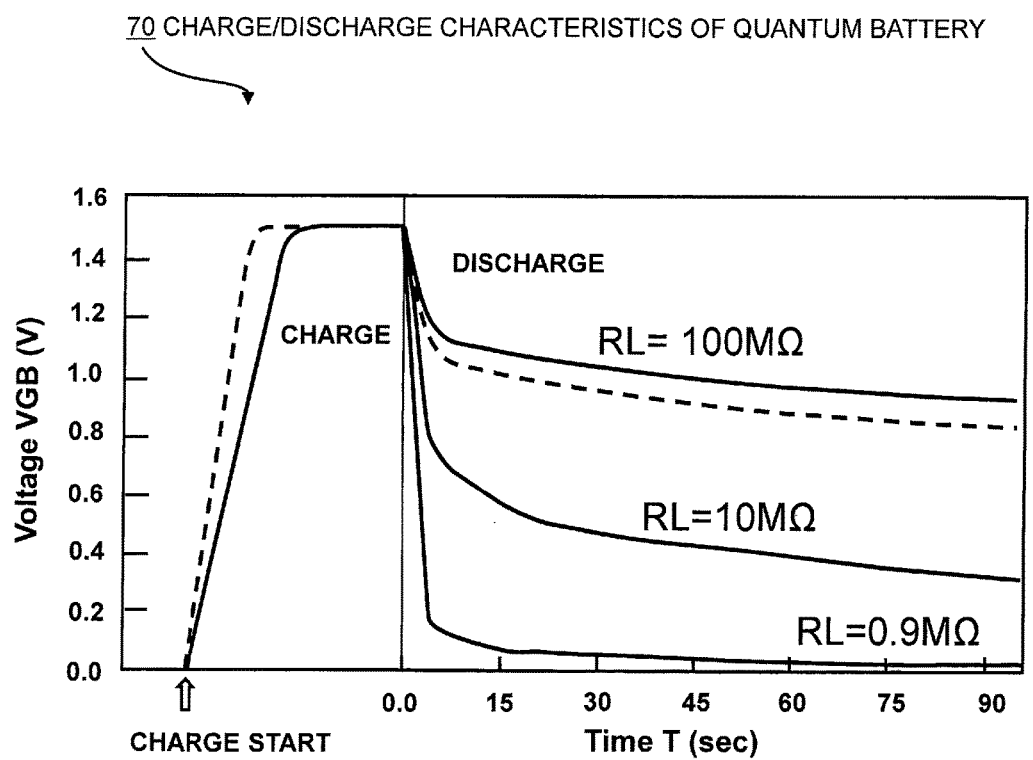
FIG. 8 is a chart illustrating charge/discharge characteristics of the quantum battery.

FIG. 8 illustrates an example of the result of charge/discharge characteristics 70 of the quantum battery in which the charge layer is stacked, measured by the charge/discharge characteristics testing device 60. In the measurement illustrated in FIG. 8, the upper voltage is set to 1.5 V. The charge by the constant current source 62 linearly increases the voltage up to the limiter voltage at the same time of the start of charge. The inclination of the voltage differs depending on the current value of the constant current source 62, but takes a constant inclination at a predetermined current value, and is usually measured in 1 sec or less. The inclination varies if there is a defect in the charge layer 18 of the quantum battery such that, for example, if the charge layer 14 has a region that is not charged, the charge amount decreases to result in the inclination illustrated by a broken line in FIG. 8.

After the evaluation of the charge characteristics, the constant current source 62 of the charge/discharge characteristics testing device 60 is switched to the discharge resistor 66, and the discharge characteristics are evaluated. The discharge characteristics depend on a resistance value RL of the discharge resistor 66. The discharge characteristics illustrated in FIG. 8 illustrate the case of the resistance values RL set to 100 M Ω, 10 M Ω, 0.9 M Ω. The discharge characteristics depending on the resistance value RL of the discharge resistor 66 with time are illustrated with the time switched to the discharge resistor 66 being 0.

In the discharge characteristics, the inclination varies if there is a defect in the charge layer 18 of the quantum battery such that, for example, in the case of the discharge resistance RL set to 100 MΩ in FIG. 8, if the charge layer 14 has a region that is not charged, the charge amount decreases to result in the inclination illustrated the broken line in FIG. 8.

Local measurement of the charge layer 14 of the quantum battery enables measurement of characteristics distribution in the charge layer 14. In this case, the tip shape of the semiconductor probe 50, more specifically, the shape of a part where the probe electrode 54, the metal oxide semiconductor 56, and the probe charge layer 58 are stacked, may be a square, a rectangle, or a circle with an area smaller than that of the charge layer 14, and only needs to enable local evaluation of the charge layer 18 of the quantum battery 10.

Figure 9:
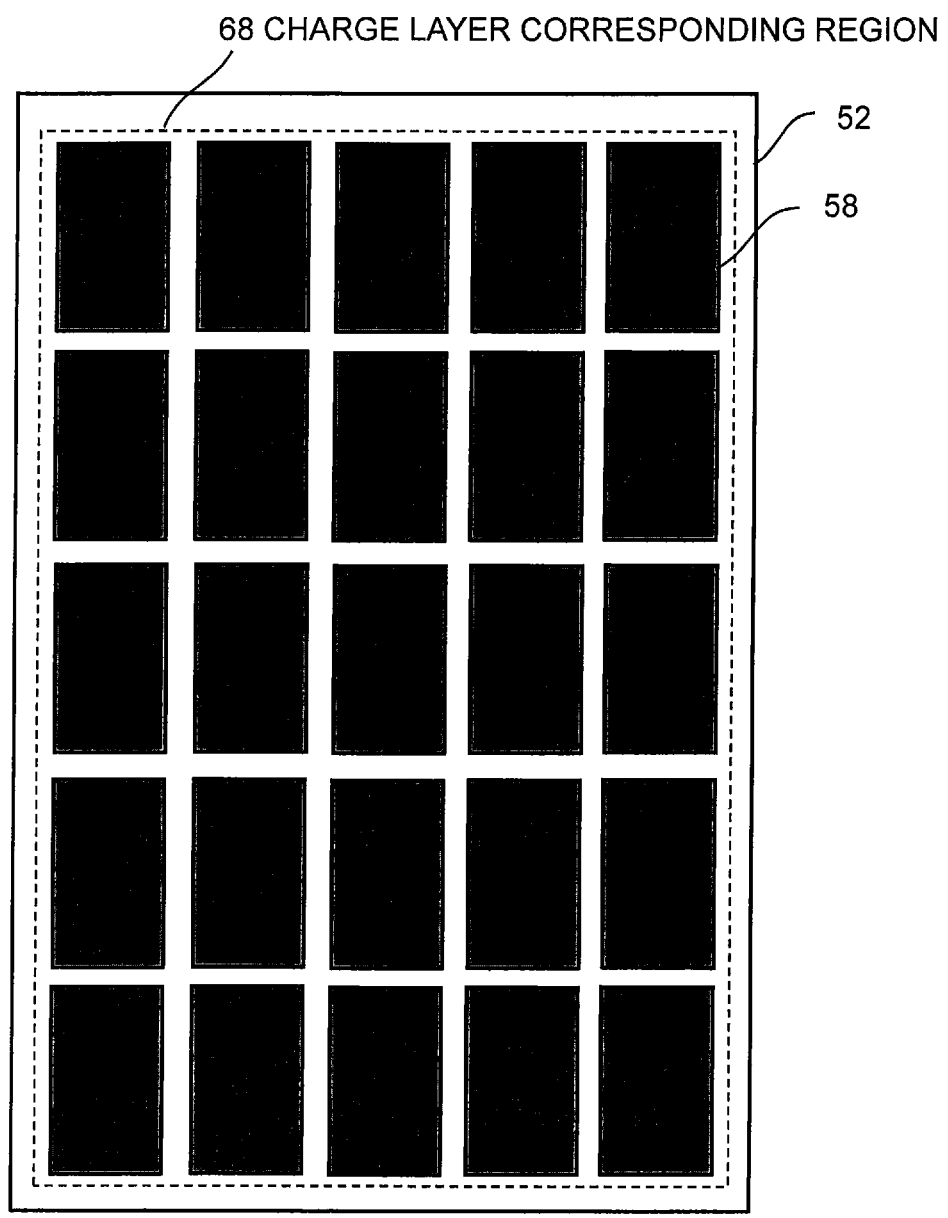
FIG. 9 is a front view of a semiconductor probe tip end provided with a plurality of measuring parts in a support body.

FIG. 9 is a view of the tip portion of one example of the semiconductor probe 50 as viewed from the front side, in which its portion stacked on the support body 52 is divided into rectangles. In each of a longitudinal direction and a lateral direction of the support body 52, five stacked parts in each of which the probe electrode 54, the metal oxide semiconductor 56, and the probe charge layer 58 are stacked, are arranged in X-axis and Y-axis directions to entirely cover the charge layer 18 of the quantum battery. When the size of the charge layer region of the quantum battery is 8 mm×25 mm, a plurality of local semiconductor probes of, for example, 1.3 mm×4.9 mm each, are formed at the tip surface of the semiconductor probe 50.

A charge corresponding region 68 corresponding to the charge layer 18 is indicated by a broken line in FIG. 9. Use of the semiconductor probe 50 enables measurement of the electric characteristics concurrently for the regions made by partially dividing the charge layer 18. Therefore, the distribution and the variation of the electric characteristics can be measured, and the difference among the divided regions can be concurrently measured.

Note that by providing a through hole electrode in the support body 52 for each divided probe electrode 54, it is possible to constitute a structure in which the charge/discharge current source is independently connected to each probe electrode.

Further, in the mass production of the quantum battery, a plurality of quantum batteries are concurrently manufactured on one substrate. When a plurality of charge layers of the quantum batteries as objects to be measured are provided on the substrate, integrally constituting semiconductor probes 50 corresponding to all of the charge layers enables concurrent evaluation of the plurality of charge layers. The semiconductor probes in this case are formed such that the support body 52 is formed in a size to cover all of the charge layers of the quantum batteries and stacked portions in each of which the probe electrode 54, the metal oxide semiconductor 56, and the probe charge layer 58 are stacked are formed in sizes and at positions corresponding to the respective charge layers on the support body 52.

The semiconductor probe 50 is not limited to the structure in which the stacked portion is formed on the plane of the support body 52, but can also be formed such that the support body is formed in a cylindrical shape and the stacked portion is formed at its peripheral surface.

Figure 10:
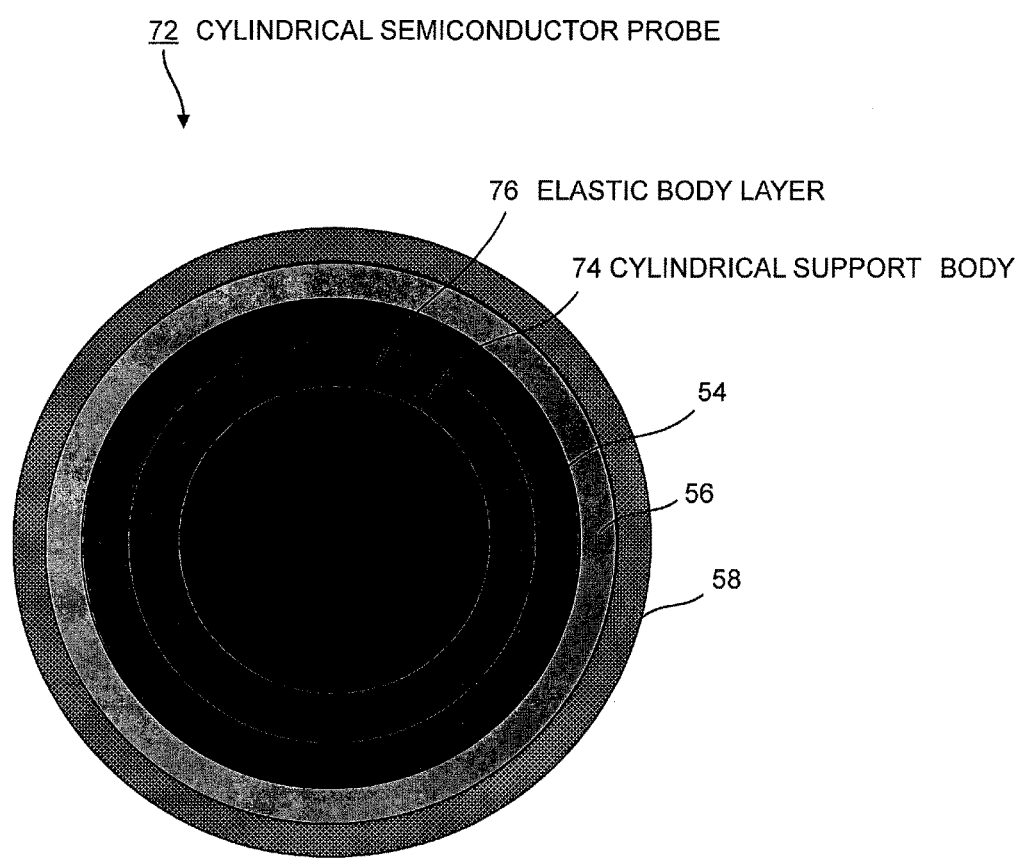
FIG. 10 is a cross-sectional view of a cylindrical semiconductor probe having a support body in a cylindrical shape.

FIG. 10 illustrates a cylindrical semiconductor probe 72. In FIG. 10, an elastic body layer 76, the probe electrode 54, the metal oxide semiconductor 56, and the probe charge layer 58 are stacked on the peripheral surface of a cylindrical support body 74, and the probe charge layer 58 has been irradiated with ultraviolet rays. The cylindrical support body 74 is a metallic shaft, and pressurized to deform the elastic body layer 76 to be able to make the contact with an object to be measured in a certain fixed width and improve the close contact property with the object to be measured.

Figure 11:
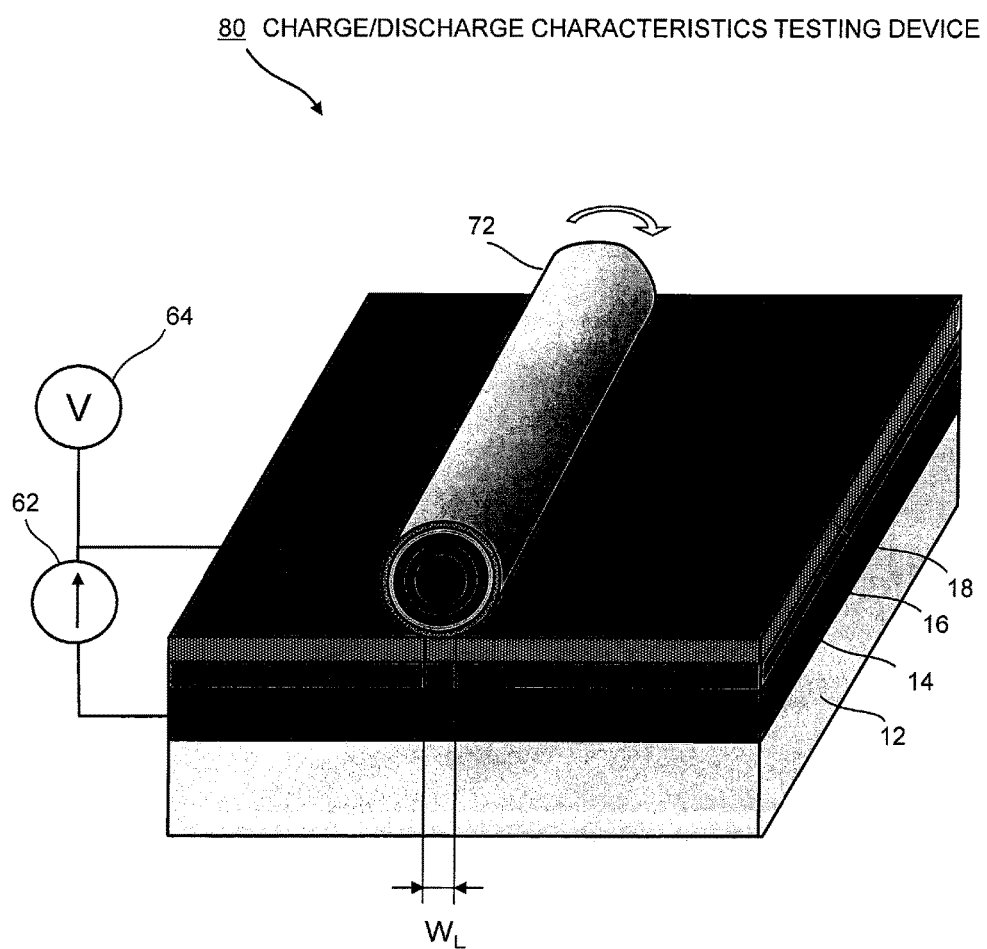
FIG. 11 is a view illustrating the outline of a charge/discharge characteristics evaluating device using the cylindrical semiconductor probe.

FIG. 11 is a schematic view of a charge/discharge characteristics testing device 74 using the cylindrical cylindrical semiconductor probe 72. When measuring the charge layer 18 of the quantum battery by the cylindrical semiconductor probe 72, the cylindrical support body 74 is rotated while being pressurized. In this event, the cylindrical cylindrical semiconductor probe 72 is rotated while being in contact with the charge layer 18 in a width $W_L$ to move on the surface as illustrated in FIG. 11. Further, the quantum battery may be rotated with the cylindrical cylindrical semiconductor probe 72 fixed to be rotatable.

When evaluating the charge characteristics, the constant current source 62 is connected to the probe electrode 54 of the cylindrical semiconductor probe 72 and the base electrode 14 of the quantum battery, and passes current therethrough. By measuring the voltage between the probe electrode 54 and the base electrode 14 by the voltmeter 64, the charge characteristics can be obtained.

Since the charge layer 18 is charged while the cylindrical semiconductor probe 72 is being rotated, a constant voltage is measured at all times.

Figure 12:
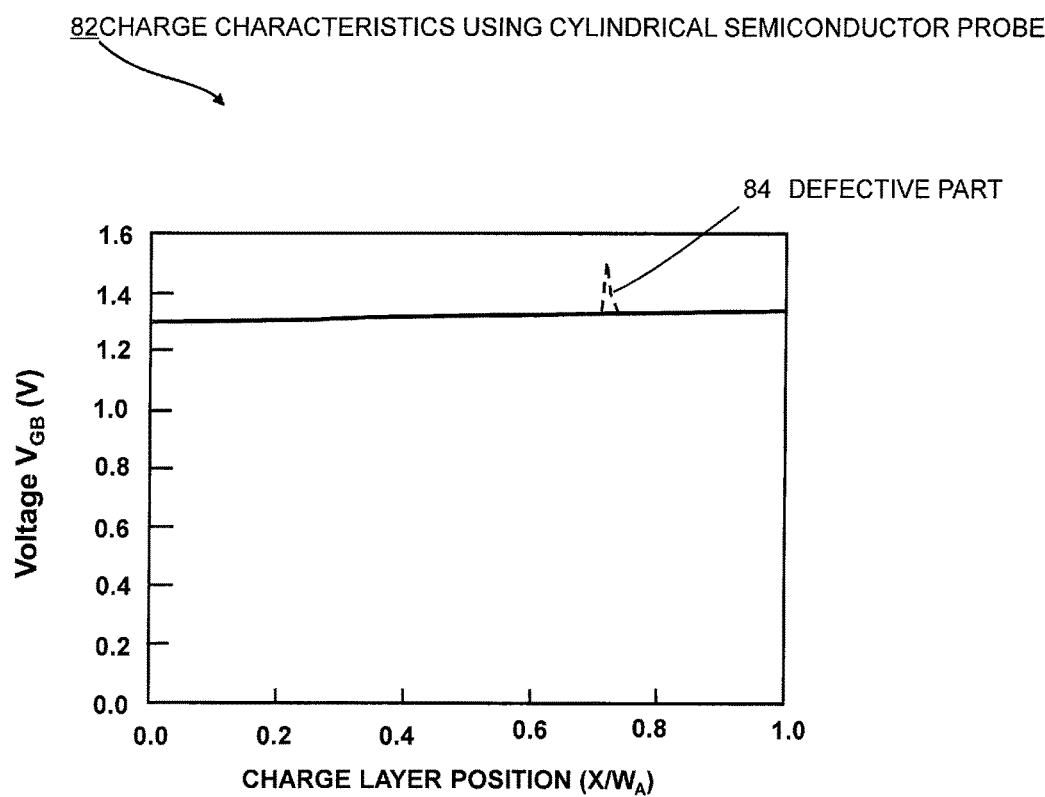
FIG. 12 is a chart illustrating charge characteristics of the charge layer measured using the cylindrical semiconductor probe.

FIG. 12 is an example of charge characteristics 82 using the cylindrical semiconductor probe 72. The vertical axis indicates the measured voltage, and the horizontal axis indicates the position of the charge layer 18 being x that is normalized by a width $W_A$ that is the width of the charge layer 18 of the quantum battery. The voltage is 1.3 V. This voltage value is determined by the rotation speed of the cylindrical semiconductor probe 72 and the current value of the constant current source 62. For example, if there is a defective part where the charge layer 18 is not formed in the charge layer 18 of the quantum battery, the defective part has no charging ability, and in the case where charge is performed with the constant current, the current flows to the other charge layer 18 in a normal state to increase the voltage. The portion indicated by a broken line in FIG. 12 is a defective part 84. From the evaluation result, the defective part of the charge layer 18 can be identified.

In the charge characteristics using the cylindrical semiconductor probe 72, the probe charge layer 58 and the charge layer 18 of the quantum battery are separated from each other after charge due to the rotation of the cylindrical semiconductor probe 72. The quantum battery stores electric energy in principle by the holes at the energy level formed during charge and the electrons 14 in the base electrode 14 forming pairs via the insulating film.

Therefore, after the probe charge layer 58 and the charge layer 18 of the quantum battery are separated from each other after charge, there is no electrons paring with the holes in the probe charge layer 58 which diffuse in the probe electrode 52 and disappear. On the other hand, in the charge layer 18 of the quantum battery, the holes remain in the charge layer due to the existence of the base electrode 14 in which the electrons are stored. Accordingly, after the charge layer 18 of the quantum battery is charged, the discharge characteristics can be evaluated using the cylindrical semiconductor probe 72.

Figure 13:
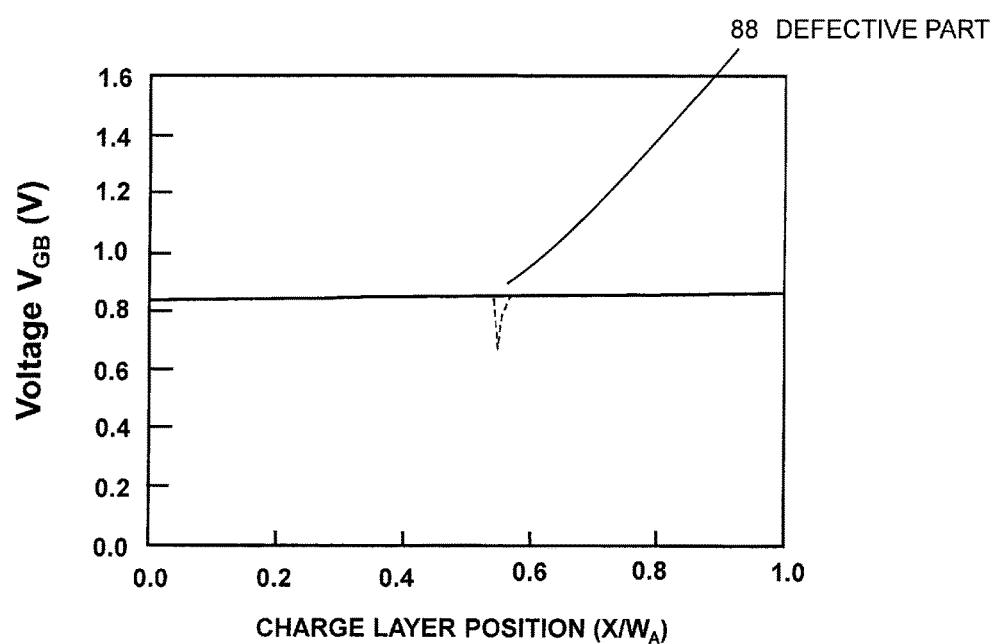
FIG. 13 is a chart illustrating discharge characteristics of the charge layer measured using the cylindrical semiconductor probe.

FIG. 13 is an example of, after evaluating the charge characteristics using the cylindrical semiconductor probe 72, evaluating the discharge characteristics again using the cylindrical semiconductor probe 72. The vertical axis indicates the measured voltage, and the horizontal axis indicates the position of the charge layer 10 being x that is normalized by the width $W_A$ that is the width of the charge layer 18 of the quantum battery.

Only the electric energy in the charge layer 18 of the quantum battery is discharged but no electric energy is stored in the probe charge layer 58. The discharge resistance RL of 10 MΩ is used. For the discharge characteristics, discharge is performed while the cylindrical semiconductor probe 72 is being rotated similarly to the charge, a constant voltage is measured at all times. If there is a defective part in the charge layer 18 of the quantum battery, the charge amount is low and therefore a decrease in the voltage is measured at a defective part 88 as indicated by a broken line in FIG. 13. In this manner, the evaluation of the charge layer 18 can be evaluated also from the discharge characteristics.

Figure 14:
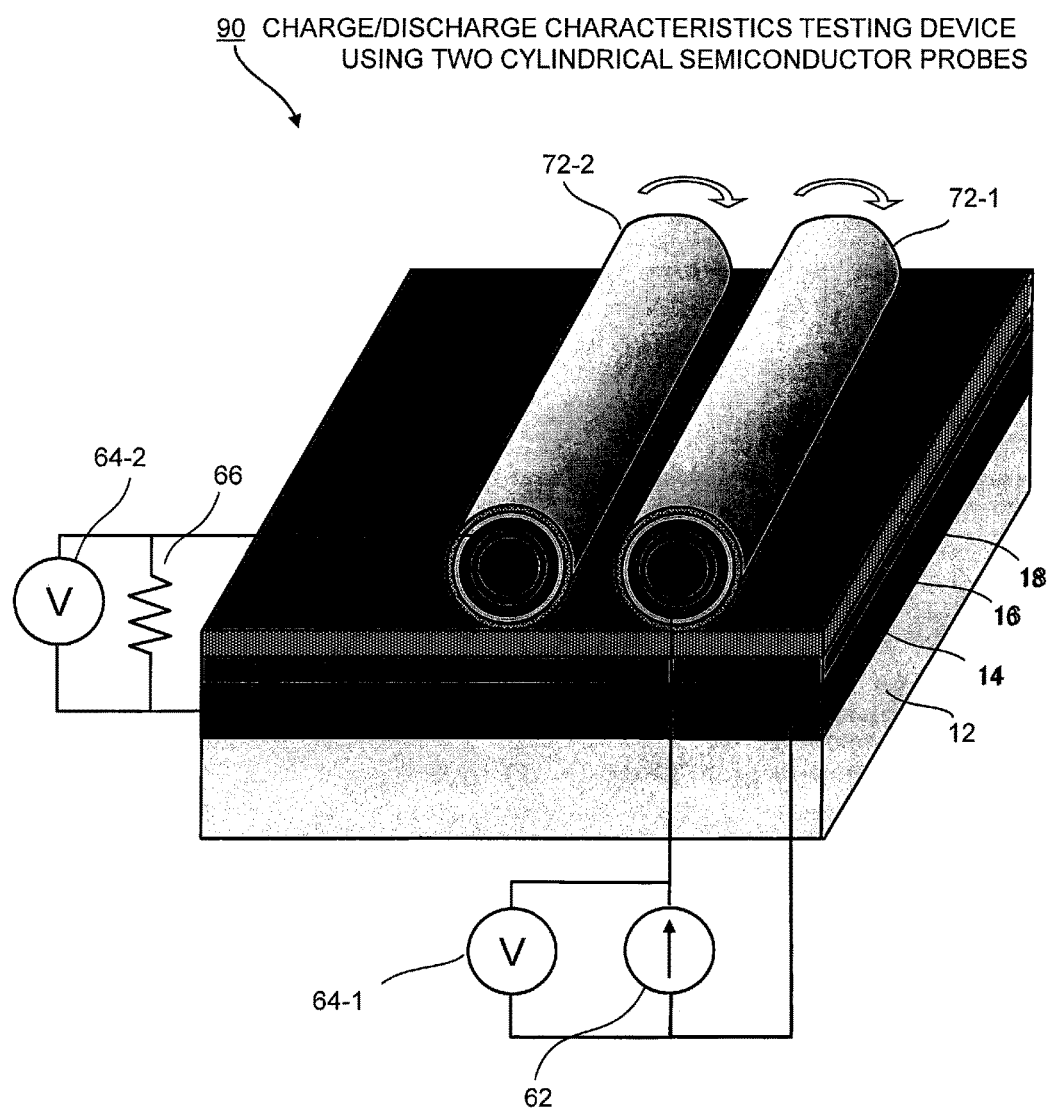
FIG. 14 is a view illustrating the outline of a charge/discharge characteristics evaluating device using two cylindrical semiconductor probes.

FIG. 14 is a charge/discharge characteristics testing device 90 using two cylindrical semiconductor probes 72. With a cylindrical semiconductor probe 72-1, a voltmeter 64-1 measures the voltage by using the constant current source 62 to obtain charge characteristics. For the discharge characteristics after charge, discharge is performed at the discharge resistor 66 by a cylindrical semiconductor probe 72-2 after the cylindrical semiconductor probe 72-1, and a voltmeter 64-2 measures the voltage. According to the charge/discharge characteristics testing device 90, the charge characteristics and the discharge characteristics can be concurrently measured, thus enabling efficient evaluation.

Figure 15:
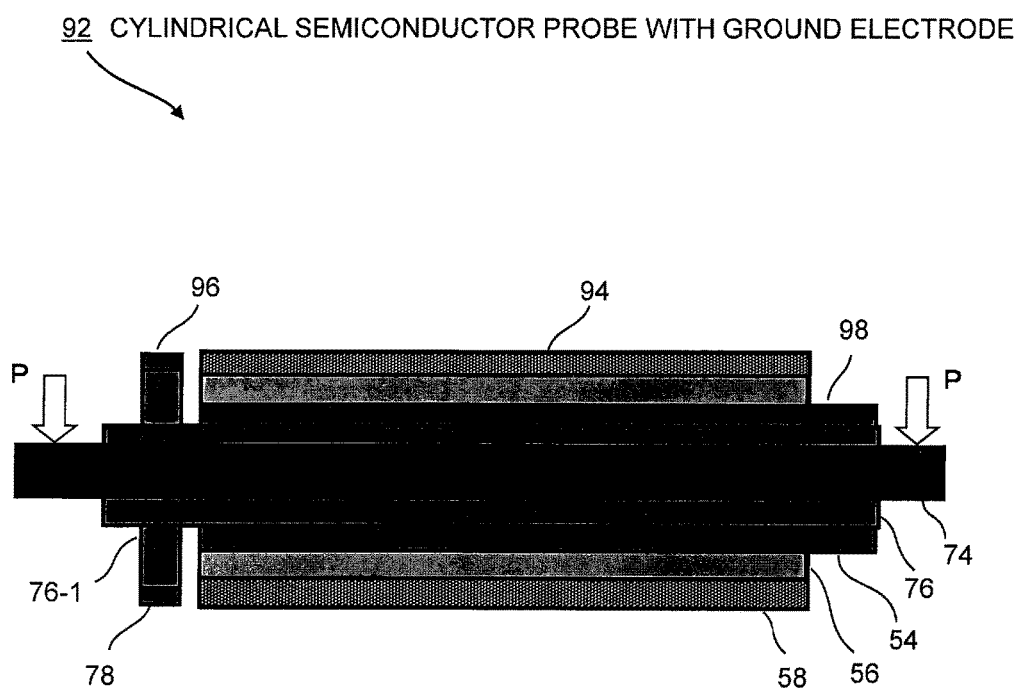
FIG. 15 is a cross-sectional view illustrating the outline of a cylindrical semiconductor probe provided with a ground electrode part.

FIG. 15 is a cross-sectional view of a cylindrical semiconductor probe 92 with ground electrode provided with a ground electrode part in order to be electrically connected with the base electrode of the quantum battery as another embodiment of the cylindrical semiconductor probe. The cylindrical support body 74 is provided with a ground electrode part 96 in parallel with a charge layer measuring probe part 94.

At the charge layer measuring probe part 94, parts of the elastic body layer 76 and the electrode 54 part are not covered by the metal oxide semiconductor 56 and the probe charge layer 58, for connection with a charge/discharge power supply, but a charge/discharge power supply connection part to which a charge/discharge power supply is connected. At the ground electrode part 96, a ground electrode 78 is provided on an elastic body layer 76-1. The ground electrode 78 is brought into contact with the base electrode of the quantum battery to form an earth. The charge/discharge power supply is connected to a charge/discharge power supply connection part 98 and the ground electrode 78.

The cylindrical semiconductor probe 92 with ground electrode is made such as to apply a pressure P on both end portions of the cylindrical support body 74 as illustrated in FIG. 15 to deform the elastic body layers 76, 76-1 to improve the close contact property with the object to be measured.

Figure 16:
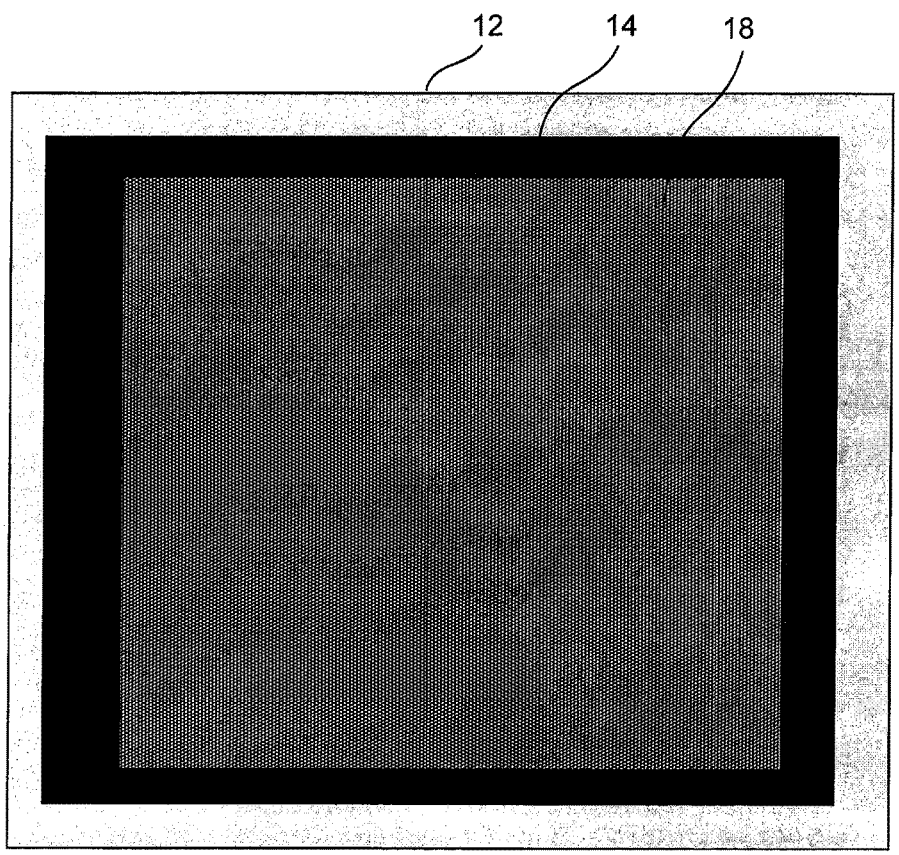
FIG. 16 is a view for explaining a charge layer surface of the quantum battery measured by the cylindrical semiconductor probe with the ground electrode part.

FIG. 16 is a plan view of the quantum battery for measuring the charge/discharge characteristics by the cylindrical semiconductor probe 92 with ground electrode illustrated in FIG. 15. The base electrode 14 stacked on the substrate 12 is wider than the charge layer 18, so that the charge/discharge characteristics are measured while the cylindrical semiconductor probe 92 with ground electrode is being rotated with the ground electrode part 96 provided therein brought into contact with the portion of the base electrode and the charge layer measuring probe part 94 brought into contact with the charge layer 18.

Further, the present invention provides a charge/discharge characteristics testing method using a semiconductor probe, including: preparing: a semiconductor probe constituted by stacking a conductive electrode, a metal oxide semiconductor layer a made of metal oxide semiconductor, a charge layer that charges electric energy therein, and a support bod; an object to be measured; a charge/discharge current source that performs charge/discharge; and a voltmeter that measures a voltage of the object to be measured at the time of charge/discharge; and bringing the semiconductor probe into contact with the object to be measured; charging/discharging by the charge/discharge current source; and measuring the voltage of the object to be measured by the voltmeter.

Though the embodiments of the present invention have been described above, the present invention includes appropriate modifications without impairing its object and advantages and is not limited by the above embodiments.

EXPLANATION OF CODES 10 quantum battery
12 substrate
14 base electrode
16 n-type metal oxide semiconductor layer
18 charge layer
20 p-type metal oxide semiconductor layer
22 counter electrode
26 n-type metal oxide semiconductor
28 insulating coating
30 electrode
32 intermediate crystalline layer
34 n-type metal oxide semiconductor layer
36 conduction band
38 valence band
40 Fermi-level
42 ultraviolet ray
44 electron
46 hole
48 energy level
50 semiconductor probe
52 support body
54 probe electrode
56 metal oxide semiconductor
58 probe charge layer 60, 80 charge/discharge characteristics testing device
62 constant current source
64, 64-1, 64-2 voltmeter
66 discharge resistor
68 charge layer corresponding region
70 charge/discharge characteristics of quantum battery
72, 72-1, 72-2 cylindrical semiconductor probe
74 cylindrical support body
76, 76-1
78 ground electrode
82 charge characteristics using cylindrical semiconductor probe
84, 88 defective part
86 discharge characteristics using cylindrical semiconductor probe
90 charge/discharge characteristics testing device using two cylindrical semiconductor probes
92 cylindrical semiconductor probe with ground electrode
94 charge layer measuring probe part
96 ground electrode part
98 charge/discharge power supply connection part

What is claimed is:

1. A semiconductor probe for evaluating electrical characteristics of a charge layer of a quantum battery during production of the quantum battery, the semiconductor probe comprising:
   a conductive electrode;
   a metal oxide semiconductor layer made of a metal oxide semiconductor; and
   a second charge layer that charges electrons therein,
   wherein the conductive electrode, the metal oxide semiconductor layer and the first charge layer are stacked on a support body in order of the conductive electrode, the metal oxide semiconductor layer, and the first charge layer,
   wherein the quantum battery comprises:
      a conductive base electrode;
      a second charge layer having an n-type metal oxide semiconductor covered with an insulating material and undergone a photoexcitation structural change to form an energy level in a band gap so as to trap electrons;
      a p-type semiconductor layer; and
      a conductive counter electrode,
   wherein the conductive base electrode, the second charge layer, the p-type semiconductor layer, and the conductive counter electrode are stacked on a substrate, and
   wherein the semiconductor probe evaluates the electrical characteristics of the second charge layer after the conductive base electrode and the second charge layer are stacked on the substrate.

2. The semiconductor probe according to claim 1, wherein the first charge layer is an n-type metal oxide semiconductor covered with an insulating material.

3. The semiconductor probe according to claim 1, wherein the first charge layer has an n-type metal oxide semiconductor covered with an insulating material and undergone a photoexcitation structural change by ultraviolet irradiation to form an energy level in a band gap so as to trap electrons.

4. The semiconductor probe according to claim 2, wherein the n-type metal oxide semiconductor of the first charge layer is one of titanium dioxide, tin oxide, and zinc oxide, or a complex material made by combining two or three kinds of titanium dioxide, tin oxide, and zinc oxide.

5. The semiconductor probe according to claim 2, wherein the insulating material covering the n-type metal oxide semiconductor of the first charge layer is an insulating resin or an inorganic insulating material.

6. The semiconductor probe according to claim 1, wherein the metal oxide semiconductor of the metal oxide semiconductor layer is a p-type semiconductor.

7. The semiconductor probe according to claim 6, wherein the p-type semiconductor is nickel oxide or copper/aluminum oxide.

8. The semiconductor probe according to claim 1, wherein the metal oxide semiconductor of the metal oxide semiconductor layer is an n-type semiconductor.

9. The semiconductor probe according to claim 8, wherein the n-type semiconductor is one of titanium dioxide, tin oxide, and zinc oxide, or a complex material made by combining two or three kinds of titanium dioxide, tin oxide, and zinc oxide.

10. The semiconductor probe according to claim 1, wherein the conductive electrode is a conductive metal.

11. The semiconductor probe according to claim 1, wherein at least a part of the support body is an elastic body.

12. The semiconductor probe according to claim 1, wherein the support body is in a cylindrical shape.

13. The semiconductor probe according to claim 12, wherein the support body in a cylindrical shape is provided with a ground electrode part.

14. A charge/discharge characteristics testing device, comprising:
    the semiconductor probe according to claim 1;
    an object to be measured;
    a charge/discharge current source that performs charge/discharge; and
    a voltmeter that measures a voltage of the object to be measured at the time of charge/discharge.

15. The testing device according to claim 14, wherein in the object to be measured, a conductive base electrode or a base electrode and an n-type metal oxide semiconductor layer is/are stacked on a substrate.

16. The testing device according to claim 14, wherein in the object to be measured, a base electrode or a base electrode and an n-type metal oxide semiconductor is/are stacked on a substrate, and a charge layer composed of an n-type metal oxide semiconductor covered with an insulating material is further stacked thereon.

17. The testing device according to claim 16, wherein the charge layer in the object to be measured is made of a same material as a material of the charge layer in the semiconductor probe, and has an n-type metal oxide semiconductor covered with an insulating material and undergone a photoexcitation structural change by ultraviolet irradiation to form an energy level in a band gap.

18. The testing device according to claim 14, wherein the semiconductor probe is brought into close contact with the object to be measured in a manner to cover an entire surface thereof.

19. The testing device according to claim 14, wherein the semiconductor probe is brought into close contact with a plurality of the objects to be measured in a manner to cover entire surfaces thereof so as to be able to concurrently measure the plurality of objects to be measured.

20. The testing device according to claim 14,
wherein the semiconductor probe is brought into contact with the object to be measured in a manner to cover a part thereof.

21. The testing device according to claim 20,
wherein the semiconductor probe has a support body in a cylindrical shape, and evaluates charge/discharge characteristics while being rotated on a surface of the object to be measured.

22. The testing device according to claim 21,
wherein two semiconductor probes each having the support body in a cylindrical shape are used, and one of the semiconductor probes evaluates charge characteristics of the object to be measured and another of the semiconductor probes evaluates discharge characteristics of the object to be measured.

* * * * *